United States Patent
Kapoor et al.

[11] Patent Number: 5,867,423
[45] Date of Patent: Feb. 2, 1999

[54] MEMORY CIRCUIT AND METHOD FOR MULTIVALUED LOGIC STORAGE BY PROCESS VARIATIONS

[75] Inventors: Ashok Kapoor, Palo Alto; Alex Owens, Los Gatos; Thomas R. Wik, Livermore; Raymond T. Leung, Palo Alto; V. Swamy Irrinki, Milpitas, all of Calif.

[73] Assignee: LSI Logic Corporation, Milpitas, Calif.

[21] Appl. No.: 838,799

[22] Filed: Apr. 10, 1997

[51] Int. Cl.$^6$ .................................................. G11C 11/56
[52] U.S. Cl. ........................................ 365/168; 365/185.03
[58] Field of Search .................. 365/185.03, 185.21, 365/185.22, 185.24, 168, 185.19

[56] References Cited

U.S. PATENT DOCUMENTS

| | | | |
|---|---|---|---|
| 4,057,788 | 11/1977 | Sage | 365/174 |
| 4,661,929 | 4/1987 | Aoki et al. | 365/189 |
| 5,119,330 | 6/1992 | Tanagawa | 365/168 |
| 5,172,338 | 12/1992 | Mehrotra et al. | 365/185 |
| 5,394,362 | 2/1995 | Banks | 365/189.01 |
| 5,508,958 | 4/1996 | Fazio et al. | 365/168 |
| 5,521,865 | 5/1996 | Ohuchi et al. | 365/185.22 |
| 5,638,320 | 6/1997 | Wong et al. | 365/185.19 |

*Primary Examiner*—David Nelms
*Assistant Examiner*—M. Tran
*Attorney, Agent, or Firm*—Conley, Ross & Tayon, PC; B. Noel Kivlin

[57] ABSTRACT

A circuit and method which enables storage of more than two logic states in a memory cell by selectively setting threshold voltages of transistors in a memory array according to the present invention. In one embodiment, a memory circuit includes an array of storage transistors. Each storage transistor has a gate connected to an associated read line. When a read line is asserted, the current which flows through a selected storage transistor is indicative of the stored logic state. The current through each transistor is individually selected by setting the threshold voltage of each storage transistor during manufacture. Different transistors in the array are configured with differing threshold voltages to thereby represent different storage states. An analog-to-digital (A/D) converter is coupled to the selected storage transistor so as to sense the current and determine the state represented. Since each cell may represent one of more than two storage states, the memory circuit may advantageously allow an increased number of bits to be stored in each memory cell, thereby increasing the storage density and reducing the cost per bit.

22 Claims, 5 Drawing Sheets

MEMORY CIRCUIT AND METHOD FOR MULTIVALUED LOGIC STORAGE BY PROCESS VARIATIONS

BACKGROUND OF THE INVENTION

1. Field of the Invention

This invention relates to the field of solid state devices for information storage, and in particular to a method and structure for storing multilevel logic values in a read-only memory (ROM).

2. Description of the Related Art

Memory devices store and retrieve large quantities of digital data at electronic speeds. Early digital computers used magnetic cores as the devices in fast-access memories. With the introduction of semiconductor memory chips in the late 1960s, magnetic cores began to be replaced by integrated circuits which implement a much higher-density memory function. This not only increased the performance capabilities of the memory, but also drastically decreased its cost. By the end of the 1970s, magnetic core memories had been completely displaced as high-speed memory devices.

Memory capacities in digital systems are commonly expressed in terms of bits (binary digits), since a separate device or circuit is used to store each bit of data. Each storage element is referred to as a cell. Memory capacities are also sometimes stated in terms of bytes (8 or 9 bits) or words (arbitrarily defined, but commonly 16–80 bits). Every bit, byte, or word is stored in a particular location, identified by a unique numeric address. Only a single bit, byte, or word is stored or retrieved during each cycle of memory operation.

The units of memory storage capacity are typically kilobits and megabits (or kilobytes and megabytes). Since memory addressing is based on binary codes, capacities that are integral powers of 2 are typically used. As a result, a memory device with a 1-kbit capacity can actually store 1024 bits, and a 64-kbyte device can store 65,536 bytes.

In digital computers, the number of memory bits is usually 100 to 1000 times greater than the number of logic gates, which implies that the memory cost per bit must be kept very low. In addition, it is desirable for the memory devices to be as small as possible (since this will allow the highest density of cells on a chip), to operate at a high speed, to have a small power consumption, and to operate reliably. To achieve this end, memory cells are designed to be as simple and compact as possible. Typically, the cell itself is not capable of outputting digital data in an electrical form compatible with the requirements of the remainder of the system. To restore the electrical characteristics of the cell's outputted data to adequate values, properly designed peripheral circuits (e.g. sense amplifiers, memory registers, and output drivers) are necessary. These circuits are designed to be shared by many memory cells. The trade-off thus made is that of a less robust output signal from the cell, in exchange for a simple, compact memory cell design.

The most flexible digital memories are those that allow for data storage (hereafter, writing) as well as data retrieval (hereafter, reading). Memories in which both of these functions can be rapidly and easily performed, and whose cells can be accessed in random order (independent of their physical locations), are referred to as random-access memories (RAMs). Read-only memories (ROMs) are those in which only the read operation can be performed rapidly. Entering data into a ROM is referred to as programming the ROM. This operation is much slower than the writing operation used in RAMs.

The storage cells in a typical semiconductor memory are arranged in an array consisting of horizontal rows and vertical columns. Each cell shares electrical connections with all the other cells in its row, and column. The horizontal lines connected to all the cells in the row are called word lines, and the vertical lines (along which data flows into and out of the cells) are referred to as data lines. Each cell therefore has a unique memory location, or address, which can be accessed at random through the selection of the appropriate word and data line. Some memories are designed so that all The cells in a row are accessed simultaneously. This array configuration of semiconductor memories lends itself well to the regular structured designs which are favored in VLSI.

There are a number of important circuits on the periphery of the array. One such peripheral circuit is the address decoder. This circuit allows a large number of word and data lines to be accessed with the fewest number of address lines. Address decoders for this purpose have $2^n$ output lines, with a different one selected for each different n-bit input code. In later generations of memory circuits, address multiplexing was integrated on some memory chips to reduce the number of address pins by half.

Another peripheral circuit is the read/write control circuitry. This circuitry determines whether data is to be written into or read from the memory. Because such circuits also amplify and buffer the data signals retrieved from the cells, one of the important circuits in this subsystem is the sense amplifier. In dynamic memories that need periodic data refreshing, refresh circuitry may also be provided.

Recently, additional peripheral circuits have been added to the basic memory organization structure. These circuits serve mainly to improve the manufacturability and testability of the chips. Those designed to increase manufacturability include redundancy circuits and error-correction circuits. Redundancy circuits allow some defective chips to be salvaged, while self-testing circuits reduce testing time. Error-detection and correction techniques involve the addition of parity bits to allow the system to detect bad data, accomplish parity checking, and in some cases provide correction of the data errors.

Most RAMs have only one input-data lead and one output-data lead (or a single combined input/output lead). Writing into and reading from such RAMs is done one bit at a time. Other RAMs have a number of input- and output-data leads, with the number determined by the word length of the system's data bus. ROMs, on the other hand, are typically organized so that the number of output-data leads is the same as the number of lines on the data bus. ROMs are programmed word by word and are read from in the same manner.

In semiconductor RAMs, information is stored on each cell either through the charging of a capacitor or the setting of the state of a bi-stable flip-flop circuit. With either method, the information on the cell is destroyed if the power is interrupted. Such memories are therefore referred to as volatile memories. When the charge on a capacitor is used to store data in a semiconductor-RAM cell, the charge needs to be periodically refreshed, since leakage currents will remove it in a few milliseconds. Hence, volatile memories based on this storage mechanism are known as dynamic RAMs, or DRAMs.

If the data is stored (written) by setting the state of a flip-flop, it will be retained as long as power is connected to the cell (and flip-flop is not reset by another write signal). RAMs fabricated with such cells are known as static RAMs, or SRAMs. Volatile RAMs can be treated as non-volatile if they are provided with a battery backup. Some DRAM and SRAM chips are even packaged together with a battery to facilitate implementation of this approach.

It is often desirable to use memory devices that will retain information even when the power is interrupted. Magnetic media offer such nonvolatile-memory storage. In addition, a variety of semiconductor memories have been developed with this characteristic. At present, virtually all such nonvolatile memories are ROMs. While data can be entered into these memories, the programming procedure varies from one type of ROM to the other.

The first group of nonvolatile memories consists of those ROMs in which data is entered during manufacturing, and cannot be subsequently altered by the user. These devices are known as masked ROMs (or simply ROMs). The next category consists of memories whose data can be entered by the user (user-programmable ROMs). In the first example of this type, known as a programmable ROM, or PROM, data can be entered into the device only once. In the remaining ROM types, data can be erased as well as entered. In one class of erasable ROMs, the cells must be exposed to a strong ultraviolet light in order for the data to be erased. These ROMs are called erasable-programmable ROMs, or EPROMs. In the final type, data can be electrically erased as well as entered into the device; these are referred to as EEPROMs. The time needed to enter data into both EPROMs and EEPROMs is much longer than the time required for the write operation in a RAM. As a result, none of the ROM types can at present be classified as fully functional RAM devices.

Many variations on the basic memory organization architecture have been developed, including video RAMs and multiport RAMs. Architectures which combine memory and logic circuits on the same chip are becoming increasingly popular. But the primary trends in semiconductor memory development are to increase the storage density and to reduce the cost per bit. It would therefore be desirable to have a method and structure for further increasing the bit storage density and reducing the cost per bit.

SUMMARY OF THE INVENTION

The problems outlined above are in large part solved by a circuit and method which enables storage of more than two logic states in a memory cell by selectively setting threshold voltages of transistors in a memory array according to the present invention. In one embodiment, a memory circuit includes an array of storage transistors. Each storage transistor has a gate connected to an associated read line. When a read line is asserted, the current which flows through a selected storage transistor is indicative of the stored logic state. The current through each transistor is individually selected by setting the threshold voltage of each storage transistor during manufacture. Different transistors in the array are configured with differing threshold voltages to thereby represent different storage states. An analog-to-digital (A/D) converter is coupled to the selected storage transistor so as to sense the current and determine the state represented. Since each cell may represent one of more than two storage states, the memory circuit may advantageously allow an increased number of bits to be stored in each memory cell, thereby increasing the storage density and reducing the cost per bit.

Broadly speaking, the present invention contemplates a memory circuit comprising an array of transistors including at least a first transistor having a first threshold voltage and a second transistor having a second threshold voltage different from the first. The memory circuit further comprises an analog-to-digital converter coupled to detect a value indicative of a threshold voltage of a selected transistor within the array. The analog-to-digital converter is configured to convert the detected value to one of at least three distinct digital values. The memory circuit also includes an address decoder configured to assert a read signal in response to receiving an address signal. The assertion of the read signal results the detection of the value by the analog-to-digital converter.

The present invention further contemplates a method for storing more than two logic states in a memory cell. The method comprises fabricating an array of storage transistors wherein each storage transistor has a threshold voltage, a first terminal, a second terminal, and a gate. The first terminal of each storage transistor is coupled to a predetermined voltage. The second terminal is coupled to an associated read data line, and the gate is coupled to receive an associated read signal. Each storage transistor is configured to conduct a current indicative of the threshold voltage when the associated read signal is asserted. The array includes transistors having different threshold voltages to thereby form different storage states. The method further comprises fabricating an analog-to-digital converter coupled to detect a value indicative of a voltage across one of said storage transistors, and configured to convert it to one of at least three distinct digital values.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
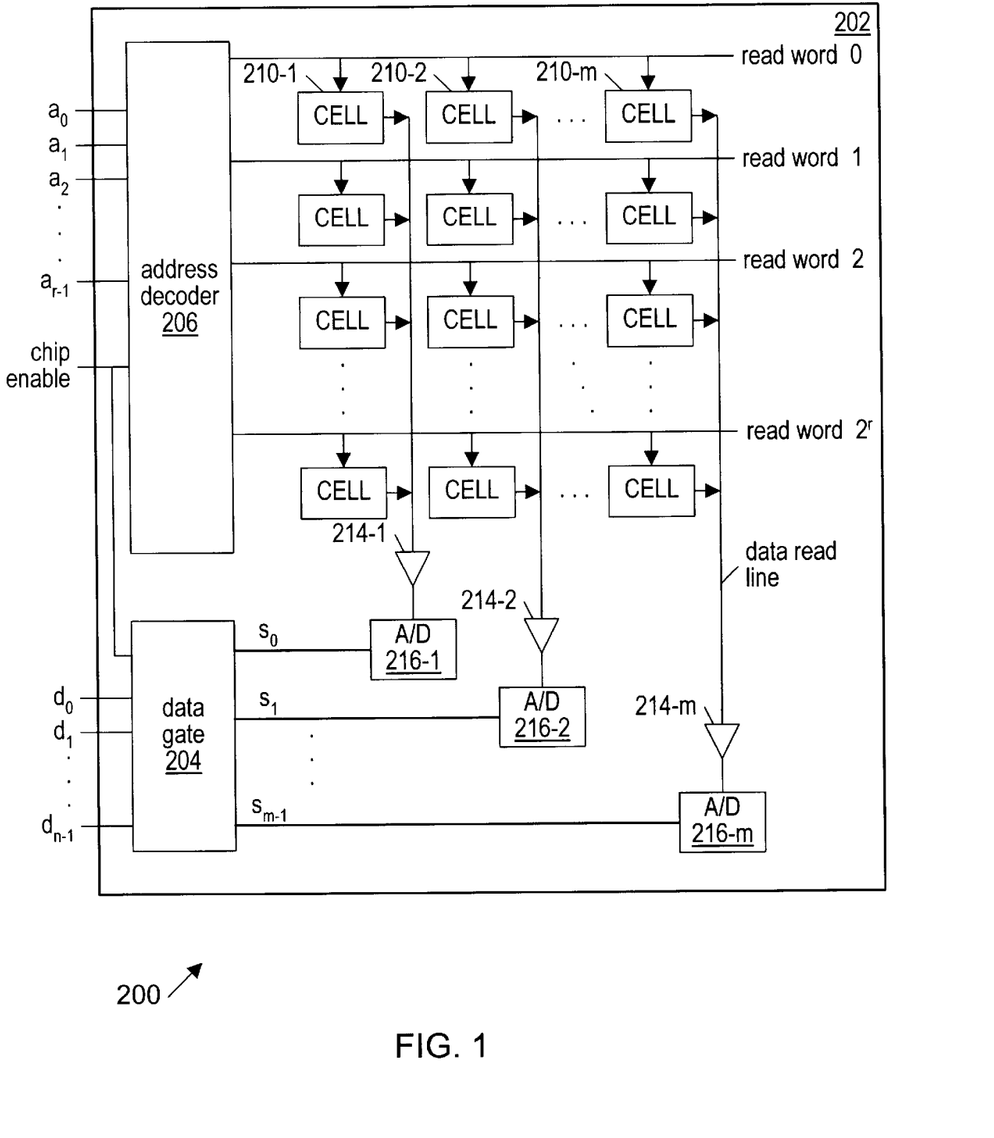
FIG. 1 is a block diagram of a semiconductor memory architecture capable of storing multiple level logic states according to the present invention.

FIG. 1 shows an exemplary multi-level logic memory architecture. In this embodiment, memory 200 has a ground plane 202 surrounding the chip circuitry which shields the circuitry from electromagnetic noise. Memory 200 receives a chip enable signal, and r address bit signals at an address decoder 206. During operation when the chip enable signal is asserted, address decoder 206 asserts one of $2^r$ read word lines. Each of the read word lines is coupled to a row of memory cells in an array of memory cells. As will be discussed further below, each of the memory cells are configured to store multilevel logic states according to present invention. When a read word line is asserted, the corresponding row of memory cells may be read.

Memory 200 also has n binary data lines ($D_0$–$D_{n-1}$) connected to a data gate 204. Data gate 204 is coupled to receive the enable signal and is further coupled to m data paths which carry multi-value logic signals ($S_0$–$S_{m-1}$). Each of the data paths can be driven by one of a set of analog-to-digital (A/D) converters 216-1 through 216-m (referred to collectively as A/D converters 216). Each column of memory cells is coupled by a data read line to one of a set of sense amplifiers 214-1 through 214-m, which in turn provides input to one of the A/D converters 216.

To illustrate the high-level operation of memory 200, an exemplary memory read operation is now described. Consider a situation in which the address bits are all zero and the chip enable signal is asserted. Upon occurrence of this situation, address decoder 206 asserts the read word line for word 0 (i.e. "Read word 0"). This causes cells 210-1 s through 210-m to pass a multi-level data signal indicative of information stored in the corresponding cells to the read data lines which are coupled to sense amplifiers 214-1 through 214-m (hereafter referred to collectively as sense amplifiers 214). Sense amplifiers 214 detect and amplify the multi-level data signals and pass the amplified signals to A/D converters 216-1 through 216-m (hereafter referred to collectively as A/D converters 216). A/D converters 216 convert the amplified signals to m multi-value logic signals ($S_0$–$S_{m-1}$) which are coupled to data gate 204. Data gate 204 converts the m multi-value logic signals $S_0$–$S_{m-1}$ to n binary digital signals, and drives the n bits on data lines $D_0$–$D_{n-1}$. In this manner, a multi-value logic state stored in each cell may be read.

Figure 2:
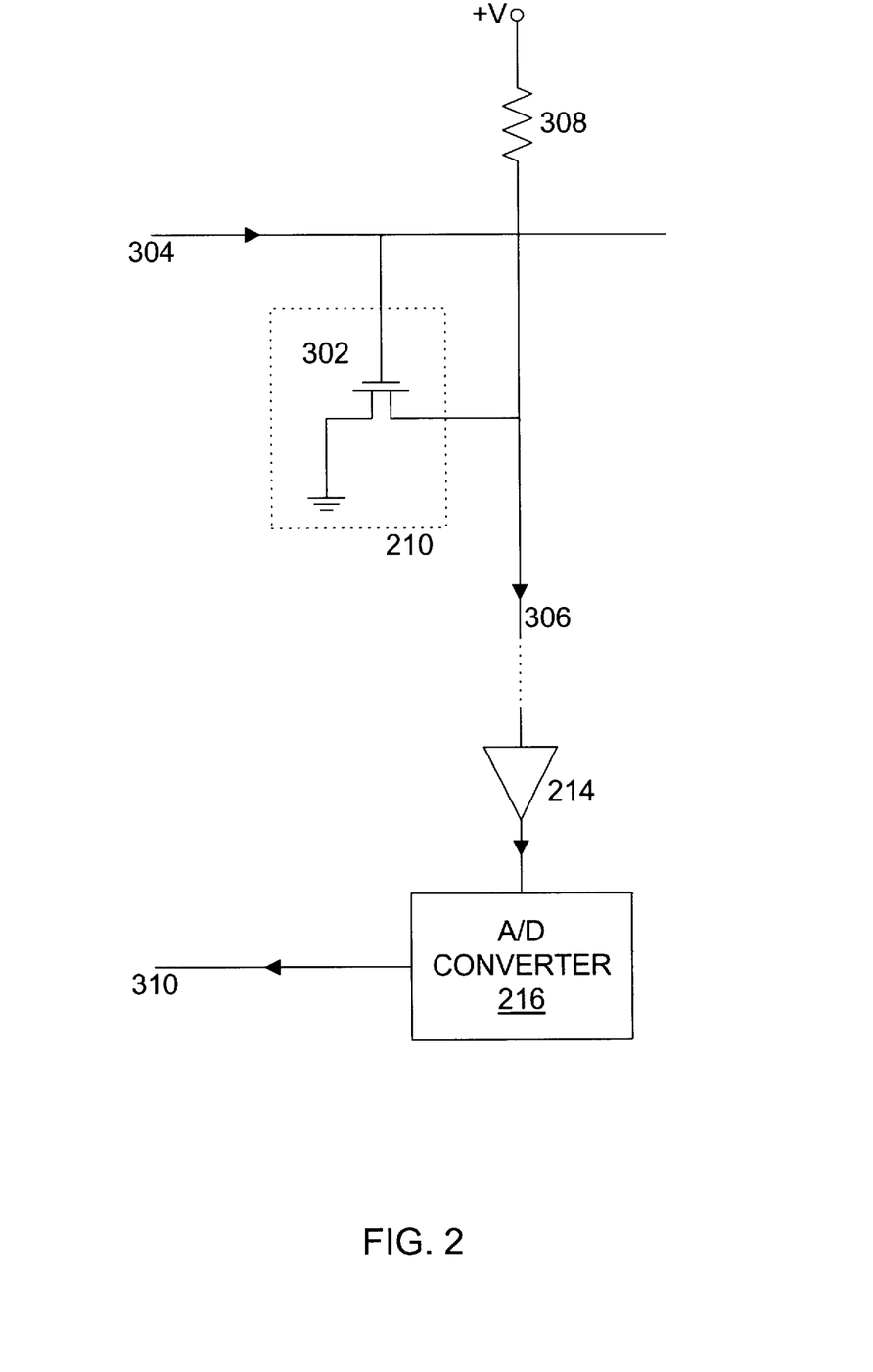
FIG. 2 is a block diagram illustrating the function of a memory cell and the read circuitry.

Turning now to FIG. 2, portions of memory circuit 200 are shown in greater detail.

Circuit portions that correspond to those of FIG. 1 are numbered identically for simplicity and clarity. FIG. 2 illustrates a memory cell 210 which is exemplary of each of the cells in the memory cell array of FIG. 1. As illustrated, in this embodiment memory cell 210 includes a storage transistor 302. The gate of storage transistor 302 is coupled to a read word line 304. One terminal of storage transistor 302 is connected to ground, and the other terminal is connected to a data read line 306. When read word line 304 is low, storage transistor 302 isolates data read line 306 from ground. When read word line 304 is high, storage transistor 302 provides a conductive path to ground. The conductivity of storage transistor 302 can then be detected using the data read line. As will be discussed in further detail below, the conductivity of the storage transistor 302 of each memory cell 210 is set by selectively controlling, during chip fabrication, the threshold voltage of the device. Various methodologies for selectively varying the threshold voltage of the devices are also discussed further below.

When a particular memory cell is being read, pull-up resistance 308, which may be implemented with a pull-up transistor, effects a voltage on the data read line which is indicative of the conductivity of storage transistor 302. Sense amplifier 214 buffers and amplifies this voltage for A/D converter 216. A/D converter 216 converts the amplified signal into a multi-value logic signal which is one of $S_0$–$S_{m-1}$.

Figure 3:
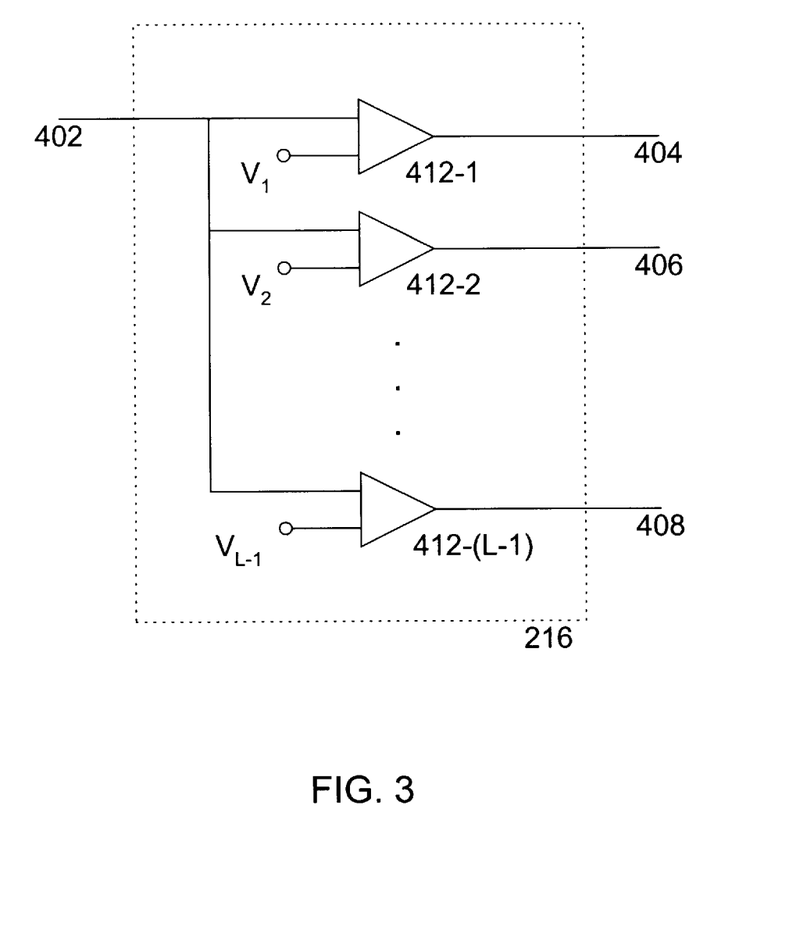
FIG. 3 is a block diagram of an analog to digital converter capable of sensing more than two stored signal states and converting them to digital form.

FIG. 3 shows a block diagram of one embodiment of A/D converter 216. A/D converter 216 receives an input signal 402 and drives a digital output signal on L-1 output lines 404–408 (which form a data path to carry one of the multi-value logic signals $S_0$–$S_{m-1}$). A/D converter 216 is comprised of L-1 comparators 412, where L is the number of logic states which can be stored in a memory cell 210. Each comparator receives one of L-1 reference voltages which demarcate the voltage regions representative of each logic state. For example, comparator 412-1 compares input signal 402 to reference voltage $V_1$, and asserts output line 404 when input signal 402 exceeds the reference voltage. The L-1 output lines accordingly have L possible states, ranging from having no lines asserted to having L-1 lines asserted.

Turning back to FIG. 1, with continued reference to FIG. 3, in one exemplary configuration of memory 200 wherein each memory cell stores one of four discrete states, memory 200 provides output on eight binary data lines $D_0$–$D_7$. The data for eight binary data lines can be represented by four quaternary logic signals. Each memory cell has a storage transistor 302 manufactured to have one of four possible channel conductivities when being read. Each of the four channel conductivities induces one of four possible voltages at the output of one of the sense amplifiers 214. For example, the possible output voltages may be 0, V/3, 2 V/3, and V, where V is the supply voltage. A/D converters 216 each include three output lines and three reference voltages which may be V/6, V/2, and 5 V/6. Thus, if the output voltage of a particular cell sensed by a sense amplifier 214 is 2 V/3, two of the three output lines are asserted by A/D converter. Data gate 204 (when enabled) converts the four quaternary logic signals $S_0$–$S_3$ to output data on eight binary data lines $D_0$–$D_7$.

In one embodiment, each storage transistor 302 of the memory array is an insulated gate field effect transistor (e.g., a MOSFET) that operates in enhancement mode. The construction and behavior of these transistors is described in many standard reference texts (see e.g. Fink et al., Electronics engineers' handbook, second edition, pp. 8.30–8.31, 1982, hereby incorporated by reference). In enhancement mode, no conductive channel exists between the source and drain without an applied gate voltage. When the gate voltage increases beyond a threshold voltage, an inversion layer forms directly below the gate, and serves as a conductive channel between the source and the drain. As the difference between the gate voltage and the threshold voltage is increased, the conductivity of the channel also increases. Thus, for a given gate voltage, the conductivity of the channel can be adjusted by altering the threshold voltage of the transistor. This provides an advantageous method for storing multi-level logic states with a single transistor. A multi-level logic ROM is constructed by representing each logic state with a channel conductivity, and by providing that channel conductivity for a given gate voltage by adjusting the threshold voltage of the transistor at the time of manufacture.

Figure 4:
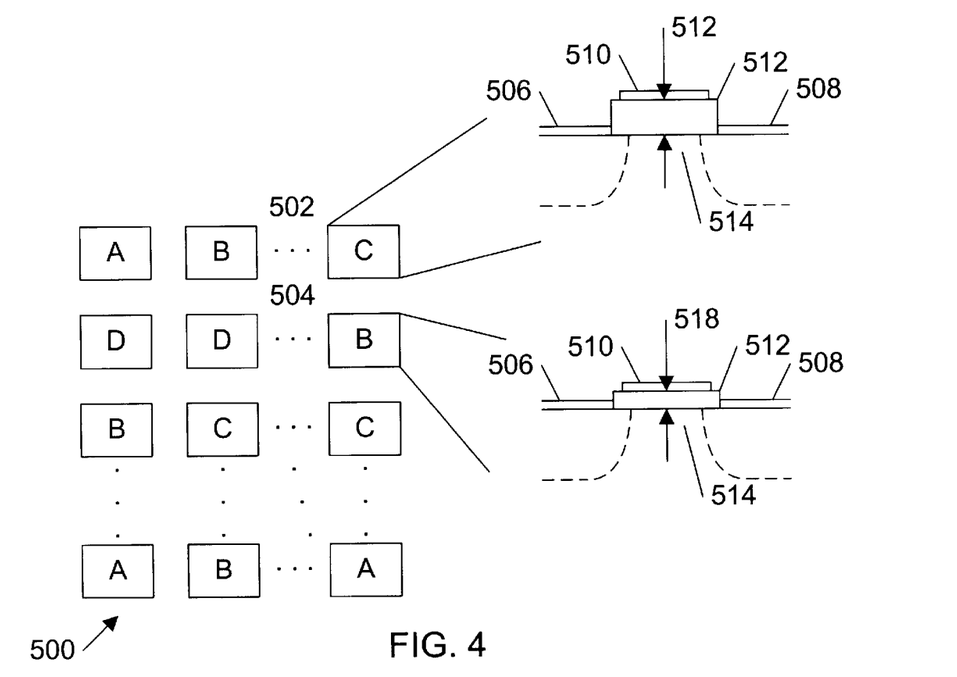
FIG. 4 is a diagram of an array of transistors manufactured to store multilevel logic states by altering the capacitance of the gate.

The threshold voltage is a complex function of the gate capacitance, the Fermi level in the silicon substrate, the work-function difference between the gate conductor and the silicon, and excess charge built up at the silicon-dielectric interface. In one embodiment, the gate capacitance is adjusted on an individual transistor basis by increasing or decreasing the thickness of the dielectric. This approach is illustrated in FIG. 4. An array 500 of transistors, which is exemplary of the memory cell array of memory 200, is shown, with individual transistors marked by the letters A, B, C, or D, denoting the logic state stored by each. Illustratively, transistors 502, 504 of array 500 are shown having different states. Exploded cross-sectional views of these transistors are also shown to better illustrate a method by which the gate capacitance is selectively set. Transistors 502, 504 each have a source 506 and a drain 508 at opposite sides of a channel 514. Channels 514 are separated from gates 510 by dielectrics 512. Transistor 502 is distinguished from transistor 504 primarily by the thickness of the dielectrics 512. Thickness 516 causes the channel of transistor 502 to have a lower conductivity when a predetermined gate voltage is applied than the channel of transistor 504 which has gate thickness 518. The differing conductivities then represent distinct logic states in array 500. Other methods for altering gate capacitance may be used. In another embodiment, different dielectric materials are used to tailor the gate capacitance on an individual basis. Using a material having a higher dielectric constant results in a decrease of the threshold voltage.

Figure 5:
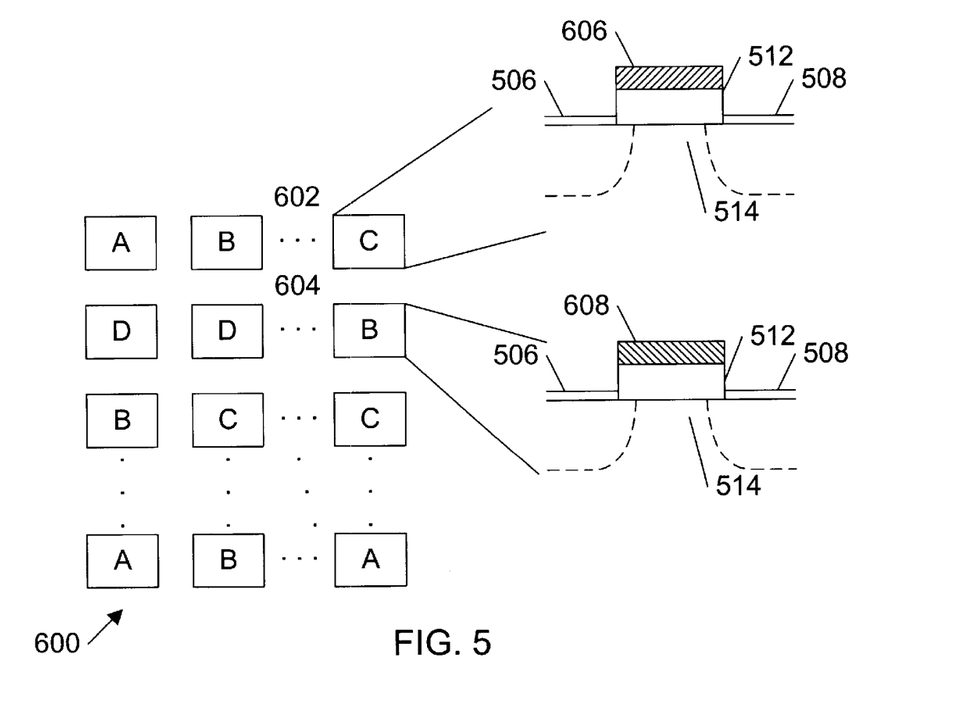
FIG. 5 is a diagram of an array of transistors manufactured to store multilevel logic states by altering the gate-substrate work function difference.

In yet another embodiment, the threshold voltage is adjusted by selectively altering the work function difference between the gate and substrate. One method for doing this uses polysilicon as a gate material and varies the impurity doping of the polysilicon. This approach is illustrated in FIG. 5. An array 600 of transistors, which is exemplary of the memory cell array of memory 200, is shown, with individual transistors marked by the letters A, B, C, or D, denoting the logic state stored by each. Illustratively, transistors 602, 604 of array 600 are shown having different states. Cross-sectional views of these transistors are also shown to illustrate a method by which the work function difference may be selectively set. Transistor 602 is distinguished from transistor 604 by the differing impurity levels in polysilicon gates 606, 608. A higher impurity doping may increase or decrease the work function difference, depending on the impurity material used. When a predetermined gate voltage is applied, the differing channel conductivities then represent distinct logic states in array 600. Other methods for manipulating the work function difference include using different gate materials.

Figure 6:
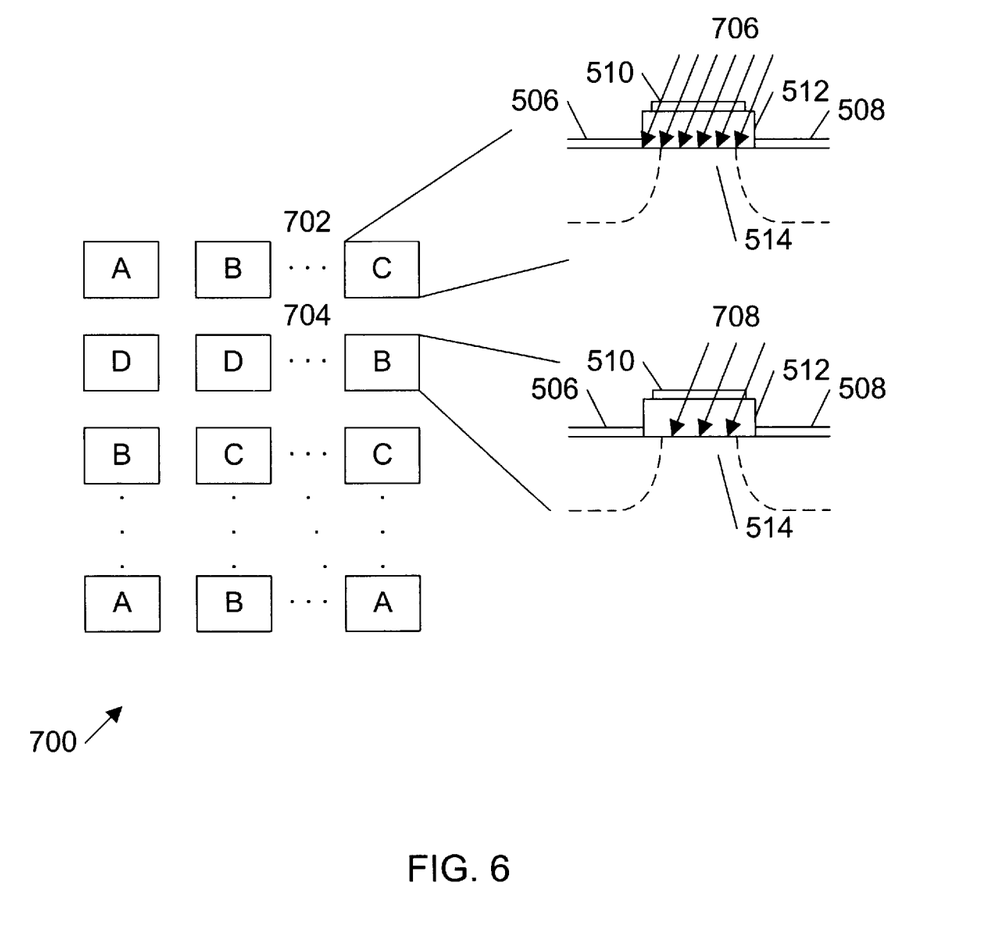
FIG. 6 is a diagram of an array of transistors manufactured to store multilevel logic states by altering the charge density of the oxide.

In yet another embodiment, the threshold voltage is adjusted by selectively altering the excess charge density for various transistors in the array. The excess charge is created by the presence of surface states at the semiconductor-dielectric interface, and the presence of impurities in the dielectric. The excess charge density can be regulated during the growth or deposition of the dielectric, or modified later by ion implantation. In some circumstances it is possible to modify the charge density chemically after construction of the dielectric. In any case, the density can be tailored on an individual transistor basis. This approach is illustrated in FIG. 6. An array 700 of transistors, which is exemplary of the memory cell array of memory 200 is shown, with individual transistors marked by the letters A, B, C, or D, denoting the logic state stored by each. Transistors 702, 704 of array 700 are shown having different states. Cross-sectional views of these transistors are also shown to illustrate a method by which the excess charge density may be selectively set. Transistor 702 is distinguished from transistor 704 by the differing excess charge densities 706, 708 at the dielectric-substrate interface. Since the excess charge may be either positive or negative, a higher density may increase or decrease the threshold voltage. When a predetermined gate voltage is applied, the differing channel conductivities then represent distinct logic states in array 700.

Numerous variations and modifications will become apparent to those skilled in the art once the above disclosure is fully appreciated. It is intended that the following claims be interpreted to embrace all such variations and modifications.

What is claimed is:

1. A memory circuit comprising:

an array of transistors including at least a first transistor having a first threshold voltage and a second transistor having a second threshold voltage different from said first threshold voltage;

an analog-to-digital converter coupled to detect a value indicative of a threshold voltage of a selected transistor within said array, wherein said analog-to-digital converter is configured to convert said value to one of at least three distinct digital values;

an address decoder configured to assert a read signal in response to receiving an address signal, wherein assertion of said read signal results the detection of said value by said analog-to-digital converter; and a data gate configured to convert a multi-level logic signal from said analog-to-digital converter into binary data bits during a read operation.

2. The memory circuit of claim 1, wherein said array further includes a third transistor having a third threshold voltage different from said first and second threshold voltages.

3. The memory circuit of claim 2, wherein said transistors each include a gate oxide, and wherein said threshold voltage difference is accomplished by causing the gate oxides to have differing thicknesses.

4. The memory circuit of claim 1, wherein said each transistor of said array includes a polysilicon gate, and wherein said threshold voltage difference is accomplished by doping the polysilicon with differing levels of an impurity which functions to alter a work function of the polysilicon.

5. The memory circuit of claim 1, wherein each transistor of said array includes a gate oxide, and wherein said threshold voltage difference is accomplished by causing the gate oxides to have differing excess charge densities.

6. The memory circuit of claim 1, wherein said analog-to-digital converter comprises a plurality of comparators, each coupled to compare said value to one of a plurality of reference voltages.

7. The memory circuit of claim 1, further comprising a sense amplifier coupled to detect a current through the selected transistor, wherein said current is indicative of the threshold voltage of the selected transistor, and wherein said sense amplifier is configured to responsively provide said value to said analog-to-digital converter.

8. A memory circuit comprising:

an address decoder configured to assert a read signal in response to receiving an address signal;

a data gate configured to convert m logic signals into n binary data bits during a read operation, wherein each of said logic signals has one of a number of distinct digital values, said number is at least three;

an array of transistors including a first storage transistor having a first threshold voltage, and a second storage transistor having a second threshold voltage different from said first threshold voltage, wherein each of said storage transistors has a first terminal, a second terminal, and a gate, wherein said first terminal of the first storage transistor is coupled to a predetermined voltage, said gate of the first storage transistor is coupled to receive said read signal, and wherein said first storage transistor is configured to conduct a current indicative of the first threshold voltage when said read signal is asserted;

a sense amplifier coupled to detect a voltage indicative of said current through said first storage transistor, said sense amplifier configured to responsively provide an input voltage; and an analog-to-digital converter coupled to detect said input voltage indicative of a voltage across said first storage transistor, wherein said analog to digital converter is configured to convert said input voltage to one of at least three distinct digital values.

9. The memory circuit of claim 8, wherein said analog-to-digital converter comprises a number of comparators, each coupled to compare said input voltage to one of a number of reference voltages, wherein said number of comparators equals said number of reference voltages, and wherein said number of reference voltages is equal to one less than said number of distinct digital values.

10. A method for storing more than two logic states in a memory cell, comprising the steps of:

fabricating an array of storage transistors wherein each storage transistor has a threshold voltage, a first terminal, a second terminal, and a gate, wherein said first terminal is coupled to a predetermined voltage, wherein said second terminal is coupled to one of a plurality of read data lines, wherein said gate is coupled to receive one of a plurality of read signals, wherein each storage transistor is configured to conduct a current indicative of the threshold voltage when a corresponding read signal is asserted, wherein said array includes a first storage transistor having a first threshold voltage, and a second storage transistor having a second threshold voltage, said first threshold voltage differs from said second threshold voltage;

fabricating an analog-to-digital converter coupled to detect a value indicative of a voltage across one of said storage transistors, wherein said analog to digital converter is configured to convert said value to one of at least three distinct digital values; and fabricating a data gate configured to convert m logic signals, each having one of said distinct digital values, into n binary data bits during a read operation.

11. The method of claim 10, further comprising the steps of:

adjusting a first set of said storage transistors to have a first threshold voltage; and adjusting a second set of said storage transistors to have a second threshold voltage.

12. The method of claim 11, wherein said storage transistors have gates comprised of polysilicon, and wherein one of said adjustments is accomplished by doping the polysilicon with an impurity so as to alter the work function of the gates.

13. The method of claim 11, wherein said storage transistors include a gate oxide having interface states, and wherein one of said adjustments is accomplished by altering the density of said interface states.

14. The method of claim 11, wherein said storage transistors include a gate oxide having a thickness, and wherein one of said adjustments is accomplished by altering the thickness.

15. The method of claim 11, further comprising the step of fabricating an address decoder configured to assert said one of said read signals in response to receiving an address signal and an enable signal.

16. The method of claim 11, further comprising the step of fabricating a sense amplifier coupled to detect said current, said sense amplifier configured to responsively provide said value to said analog-to-digital converter.

Please add the following claims.

17. A memory circuit comprising:

an array of transistors including at least a first transistor having a first threshold voltage and a second transistor having a second threshold voltage different from said first threshold voltage;

an analog-to-digital converter coupled to detect a value indicative of a threshold voltage of a selected transistor within said array, wherein said analog-to-digital converter is configured to convert said value to one of at least three distinct digital values; and an address decoder configured to assert a read signal in response to receiving an address signal, wherein assertion of said read signal results the detection of said value by said analog-to-digital converter;

wherein said analog-to-digital converter comprises a plurality of comparators, each coupled to compare said value to one of a plurality of reference voltages.

18. The memory circuit of claim 17, wherein said array further includes a third transistor having a third threshold voltage different from said first and second threshold voltages.

19. The memory circuit of claim 17, wherein said each transistor of said array includes a polysilicon gate, and wherein said threshold voltage difference is accomplished by doping the polysilicon with differing levels of an impurity which functions to alter a work function of the polysilicon.

20. The memory circuit of claim 17, wherein each transistor of said array includes a gate oxide, and wherein said threshold voltage difference is accomplished by causing the gate oxides to have differing excess charge densities.

21. The memory circuit of claim 18, wherein said transistors each include a gate oxide, and wherein said threshold voltage difference is accomplished by causing the gate oxides to have differing thicknesses.

22. The memory circuit of claim 17, further comprising a sense amplifier coupled to detect a current through the selected transistor, wherein said current is indicative of the threshold voltage of the selected transistor, and wherein said sense amplifier is configured to responsively provide said value to said analog-to-digital converter.

\* \* \* \* \*